US011067640B2

(12) United States Patent
Ruiz-Garcia et al.

(10) Patent No.: US 11,067,640 B2
(45) Date of Patent: Jul. 20, 2021

(54) LOSS OF GROUND DETECTION SYSTEM

(71) Applicant: LEAR CORPORATION, Southfield, MI (US)

(72) Inventors: Daniel Ruiz-Garcia, Valls (ES); Josep Benet-Freissinier, Valls (ES); Sergio Alquezar-Alquezar, Valls (ES); Victor Navarro-Cases, Valls (ES); Alberto Martinez-Ramirez, Valls (ES); Jordi Agusti-Batlle, Valls (ES)

(73) Assignee: LEAR CORPORATION, Southfield, MI (US)

( * ) Notice: Subject to any disclaimer, the term of this patent is extended or adjusted under 35 U.S.C. 154(b) by 147 days.

(21) Appl. No.: 16/021,638

(22) Filed: Jun. 28, 2018

(65) Prior Publication Data

US 2020/0003819 A1 Jan. 2, 2020

(51) Int. Cl.
*G01R 31/52* (2020.01)
*G05B 19/048* (2006.01)

(52) U.S. Cl.
CPC ........... *G01R 31/52* (2020.01); *G05B 19/048* (2013.01); *G05B 2219/24133* (2013.01)

(58) Field of Classification Search
None
See application file for complete search history.

(56) References Cited

U.S. PATENT DOCUMENTS

| 6,040,778 | A | * | 3/2000 | Hopkins | G01R 31/025 315/129 |
|---|---|---|---|---|---|
| 6,560,079 | B1 | | 5/2003 | Hirsh et al. | |
| 9,077,171 | B2 | | 7/2015 | Givelin et al. | |
| 9,678,135 | B2 | | 6/2017 | Tornare et al. | |
| 9,791,481 | B2 | | 10/2017 | Lucchese | |
| 2003/0030447 | A1 | * | 2/2003 | Masaoka | G01R 31/026 324/528 |
| 2007/0008666 | A1 | | 1/2007 | Morita et al. | |
| 2010/0244849 | A1 | * | 9/2010 | Yano | G01R 31/025 324/510 |
| 2016/0240022 | A1 | * | 8/2016 | Tornare | G01R 31/50 |
| 2017/0322250 | A1 | | 11/2017 | Tornare et al. | |

* cited by examiner

*Primary Examiner* — Nasima Monsur
(74) *Attorney, Agent, or Firm* — Brooks Kushman P.C.

(57) ABSTRACT

A loss of ground detection system includes a reference voltage source that provides a reference voltage, a primary ground connection that is adapted to be connected to a primary ground, a secondary ground connection that is adapted to be connected to a secondary ground, and an internal ground. The system also includes a combined ground integrity monitoring unit that outputs a multistage signal to control electronics. The multistage signal includes a first and a second output voltage. A first switch is interposed between the primary ground connection and the internal ground such that the first switch opens in response to loss of connection to the primary ground as indicated by a change of status in multistage signal, a diode system is interposed between the secondary ground connection and the internal ground, the diode system oriented to allow flow from the internal ground to secondary ground connection under forward bias.

19 Claims, 7 Drawing Sheets

LOSS OF GROUND DETECTION SYSTEM

TECHNICAL FIELD

In at least one aspect, the present invention is related to systems and a method for determining ground loss in an electric vehicle.

BACKGROUND

The determination of ground loss in electric vehicles is an important design feature. U.S. Pat. Nos. 9,791,481 and 9,678,135 and U.S. Pat. Pub. Nos. 2016/0240022 and 2017/0322250 provide information about ground loss detection systems.

SUMMARY

The present invention solves one or more problems of the prior art by providing in at least one embodiment a loss of ground detection system. The ground detection system includes a reference voltage source that provides a reference voltage, a primary ground connection that is adapted to be connected to a primary ground, a secondary ground connection that is adapted to be connected to a secondary ground, and an internal ground. The system also includes a combined ground integrity monitoring unit that outputs a multistage signal to control electronics. The combined ground integrity monitoring unit is interposed between and in electrical communication with the reference voltage source and both of the primary ground connection and the secondary ground connection. The multistage signal includes a first output voltage and a second output voltage. A first switch is interposed between the primary ground connection and the internal ground such that the first switch opens in response to loss of connection to the primary ground as indicated by a change of status in multistage signal. The system also includes a diode system interposed between the secondary ground connection and the internal ground, the diode system oriented to allow flow from the internal ground to secondary ground connection under forward bias.

In another embodiment, a method utilizing the loss of ground detection system set forth above is provided. The method includes a step of measuring the first output voltage and the second output voltage after the ground detection system is installed in a target system. The secondary ground connection is optionally determined to be disconnected from the secondary ground if the second output voltage is higher than a first predetermined threshold voltage. The primary ground connection is disconnected from ground if the second output voltage has fallen below the second predetermined threshold voltage. The primary ground connection is determined to be disconnected from the primary ground if the first output voltage is higher than a third predetermined threshold voltage. The primary ground connection is reconnected to ground if the first output voltage is not above the second predetermined threshold voltage.

DETAILED DESCRIPTION

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of" where one of these three terms is used herein, the presently disclosed and claimed subject matter can include the use of either of the other two terms.

Throughout this application, where publications are referenced, the disclosures of these publications in their entireties are hereby incorporated by reference into this application to more fully describe the state of the art to which this invention pertains.

Figure 1:
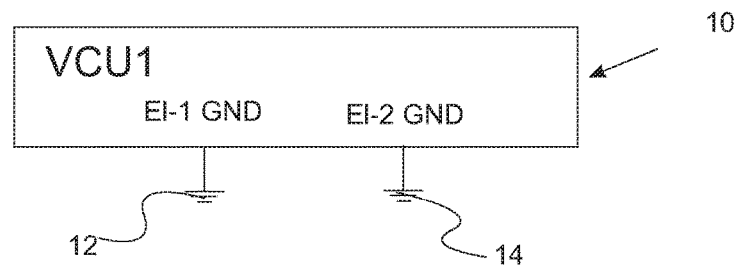
FIG. 1 is a schematic of a loss of ground detection system showing two vehicle chassis ground connections.
Figure 2:
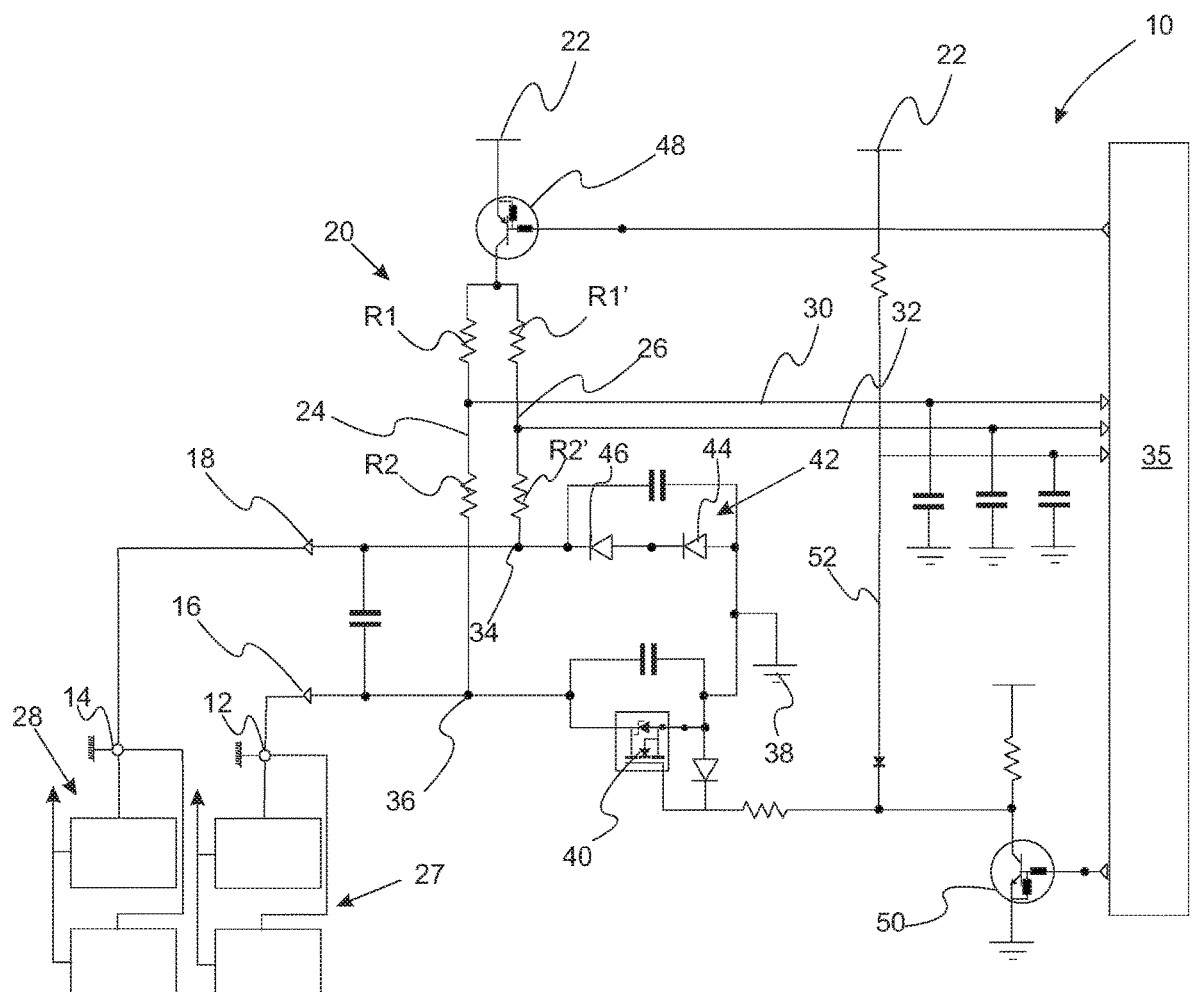
FIG. 2 is a schematic of a loss of ground detection system having a pair of voltage dividers.

FIGS. 1 and 2 provide a schematic of a loss of ground detection system for detecting ground loss in a dual-ground ECU. As depicted in FIG. 1, loss of ground detection system 10 is attached to a primary vehicle chassis ground 12 and a secondary vehicle chassis ground 14. Primary ground connection 16 can be attached to primary ground 12. Secondary ground connection 18 can be connected to secondary ground 14. Primary ground connection 16 is typically directly connected to the ground connections for other vehicle components such that loss connection of primary ground connection 16 will also lead to separation of the ground connection for these other components. Secondary ground connection 18 provides a backup path to ground for the loss of ground detection system. Central to the operation of the loss of ground detection system 10 is combined ground integrity monitoring unit 20 that outputs a multistage signal to control electronics. Combined ground integrity monitoring unit 20 is interposed between and in electrical communication with the reference voltage source 22 and both of the primary ground connection 16 and the secondary ground connection 18. The multistage signal includes a first output voltage and a second output voltage. In a variation, combined ground integrity monitoring unit 20 includes a first ground connection integrity monitoring stage 24 that outputs the first output voltage and a second ground connection integrity monitoring stage 26 that outputs the second output voltage. First ground connection integrity monitoring stage 24 being interposed between and in electrical communication with the primary ground connection 16 and the reference voltage source 22. Second ground connection integrity monitoring stage 26 being interposed between and in electrical communication with the secondary ground connection 18 and reference voltage source 22.

In a refinement, first ground connection integrity monitoring stage 24 is a first voltage divider and second ground connection integrity monitoring stage 26 is a second voltage divider each of which have an input reference voltage from reference voltage source 22. FIG. 2 shows primary ground 12 connected to battery system 27 and secondary ground 14 connected to battery system 28. The voltage divider is interposed between and in electrical communication with the primary ground connection 16 and the reference voltage source 22. First voltage divider includes series resistors R1 and R2. Similarly, the second voltage divider includes series resistors R1' and R2'. Typically, these resistors have a resistance from about 1 to 10 kilohms. The relative sizes of these resistors are determined from the voltage divider equation to provide a target value for first output voltage 30 and second output voltage 32. The first voltage divider includes first ground terminal 36 which is in direct electrical communication with primary ground connection 16. The second voltage divider is interposed between and in electrical communication with the secondary ground connection 18 and the reference voltage source 22. The second voltage divider includes second ground terminal 34 which is in direct electrical communication with secondary ground connection 18. The first voltage divider provides first output voltage 30 while the voltage divider provides second output voltage 32. In a refinement, a loss of ground at the primary ground connection 16 causes the second output voltage 32 to drop. Typically, this voltage drop is about 20% of the input reference voltage provided by reference voltage source 22 (typically a 5V supply voltage).

The system also includes a diode system 42 interposed between the secondary ground connection and the internal ground. Diode system 42 oriented to allow flow from the internal ground to secondary ground connection under forward bias. In a refinement, diode system 42 includes diodes 44, 46. The two diodes 44, 46 add a voltage drop of about 1.2 V, that is about 20% change of a 5V input with reference to secondary ground 14. Internal ground 38 rises nearly the same as first ground terminal 36. In this situation, first output voltage 30, in practice, does not change since it is a relative measurement. However, second output voltage 32 drops (e.g., about 20%) with reference to internal ground 38, because of the 1.2V increases at internal ground 38.

Similarly, a loss of ground at the secondary ground connection 18 causes the second output voltage 32 to rise to the input reference voltage plus or minus 10%. In this situation, the diodes are in reverse bias therefore, there is no current path after second ground terminal 34 (i.e., current is 0 A). In this situation, there is no voltage drop and input second output voltage 32 rises up to supply voltage (5V) (i.e., a 100% increase). Output voltages 30 and 32 provide output signals into control electronics 35. An A to D converter within control electronics 35 will digitize these signals. FIG. 2 includes a number of capacitors which assist in attenuating transient voltages.

Still referring to FIG. 2, first transistor switch 40 is interposed between the primary ground connection 16 and the internal ground 38 such that the first switch opens in response to loss of connection to the primary ground as indicated by a change of status in multistage signal. During normal operation, there is a slight voltage drop from internal ground 38 and primary ground connection 16. In a refinement, there is a voltage drop of less than 0.5 volts (typically about 0.1 to 0.3 volts) from internal ground 38 to primary ground connection 16 across the first transistor switch during normal operation in a vehicle in which there is no loss of ground where current flows from the internal ground to the primary ground connection. Diode system 42 is interposed between the secondary ground connection and the internal ground. In a refinement, diode system 42 includes diodes 44, 46 which are in series. Diode system 42 is oriented to allow flow from the internal ground to secondary ground connection under forward bias. The current flows from internal ground 38 to primary ground connection 16 through first transistor switch 40 (e.g., a CMOS or MOSFET transistor). Since the voltage drop is much lower than the voltage needed to "open" diodes 44 and 46 and since primary ground connection 16 and secondary ground connection 18 are in fact the same voltage, diodes 44 and 46 are not conducting. Therefore, only a minimal second current flows from internal ground 38 to secondary ground connection 18 through diodes 44, 46 (i.e., diodes are not ideal).

In a refinement, second transistor switch 48 is positioned between the reference voltage source 22 and both the first voltage divider and the second voltage divider. Second transistor 48 switch allows the loss of ground detection system to be actuated when desired with the first terminal and the second terminal being connected to the voltage reference source via the second transistor switch.

In a refinement, loss of ground detection system 10 includes a third transistor switch 50 that controls the first transistor switch to avoid over current through the ground from other modules proximately connected in case of loss of ground 12. Third transistor switch 50 is controlled by a control signal received from control electronics 35. In a refinement, a diagnostic signal is received from line 52 to assist in evaluating the status of first transistor switch 40 and diode system 42.

Figure 3A:
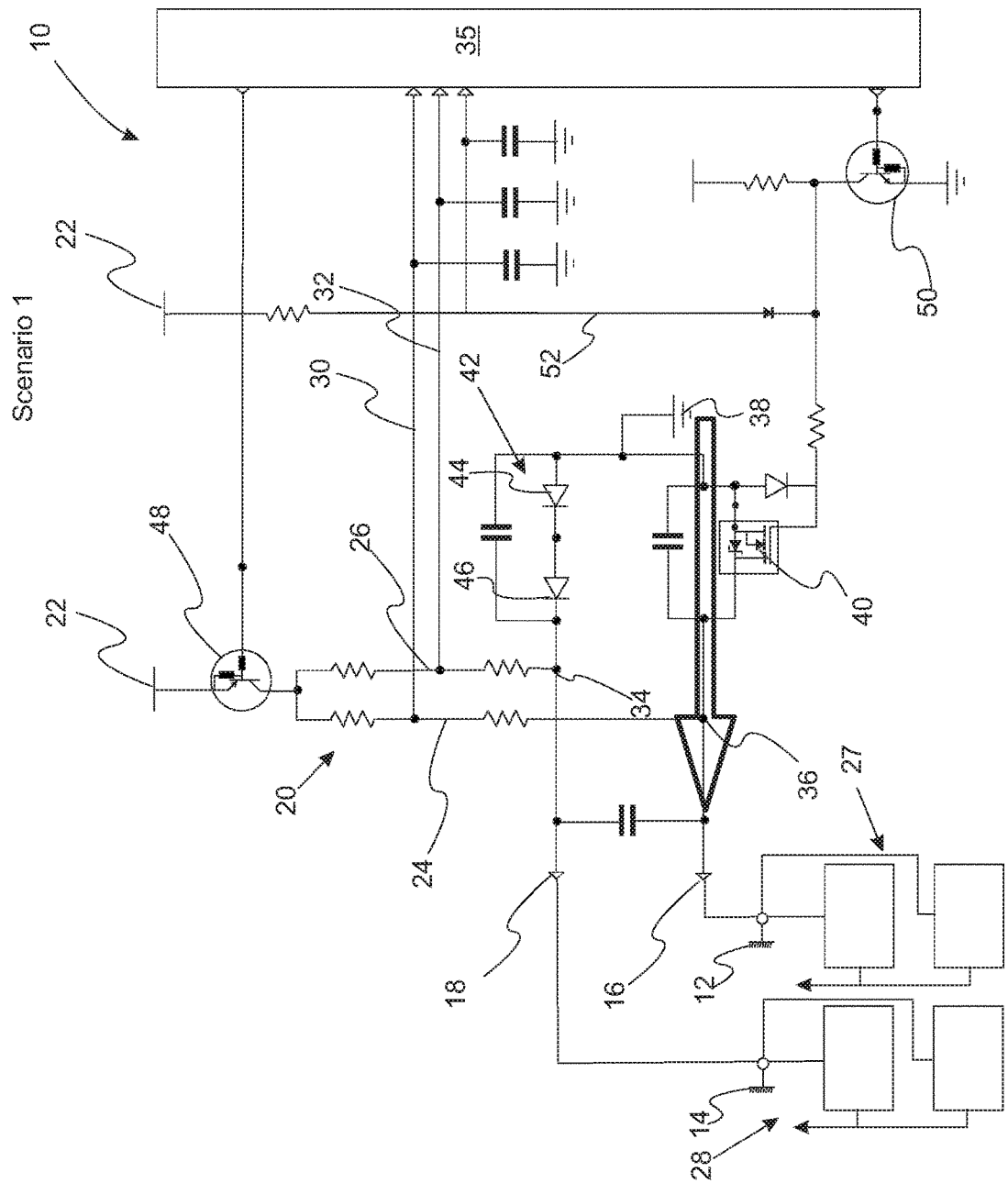
FIGS. 3A, 3B, and 3C provide schematics highlighting three scenarios in the operation of the loss of ground detection system of FIG. 2.
Figure 3B:
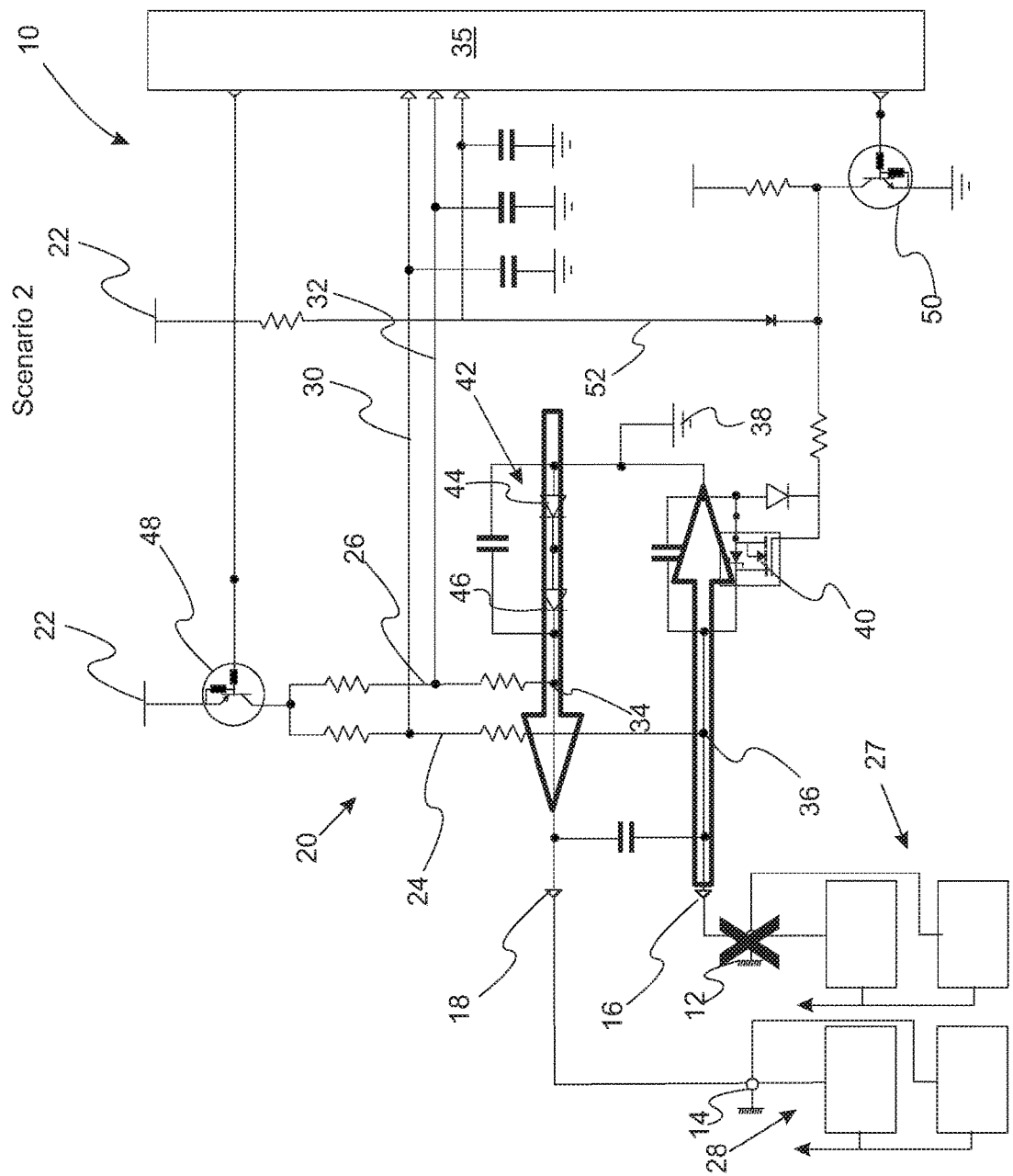
Figure 3C:
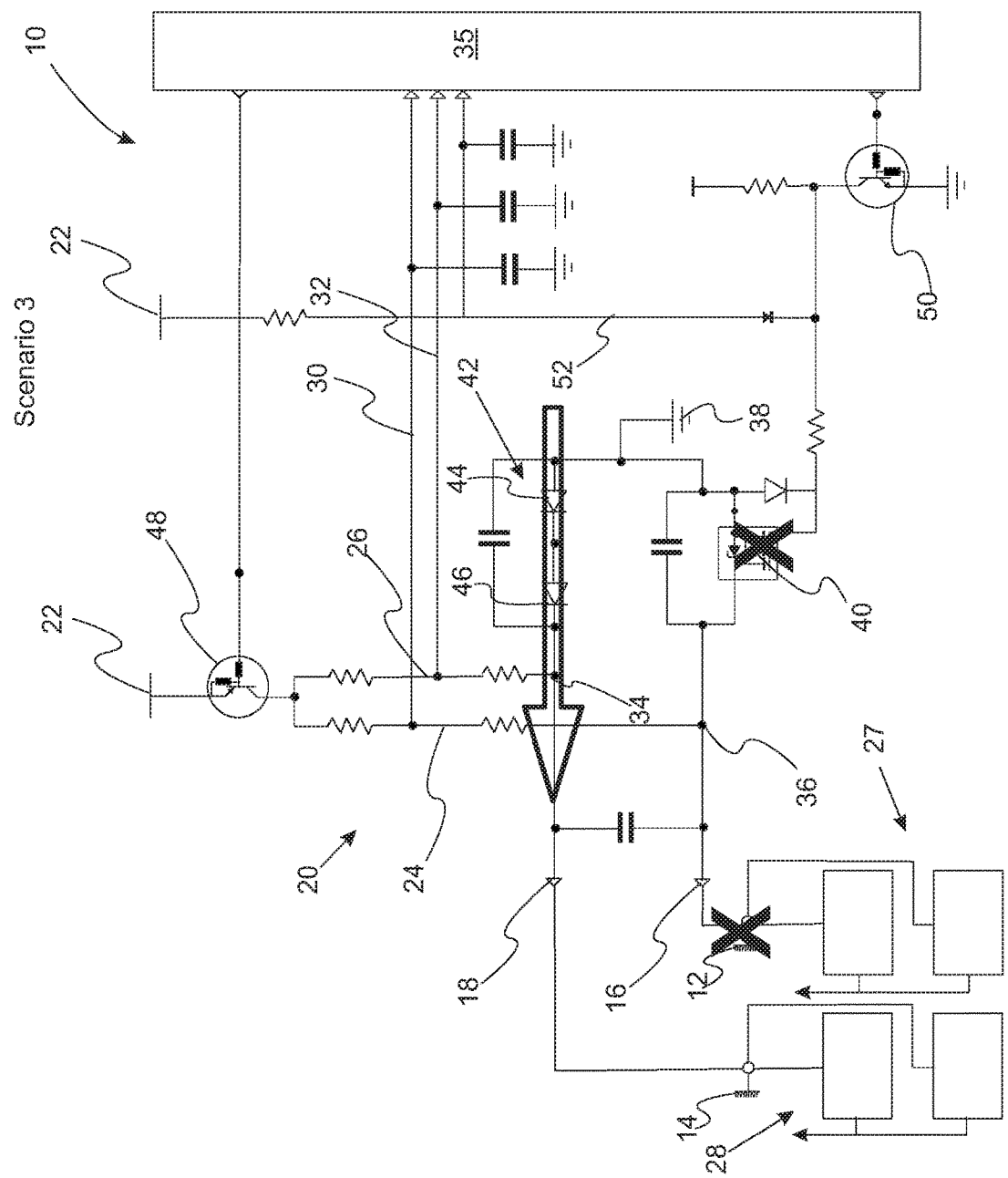

FIGS. 3A, 3B, and 3C depicts circuit voltage flows of loss of ground detection system 10 in various operation states. Scenario 1 depicted in FIG. 3A represents normal operation of the system in which primary ground connection 16 is connected and operating correctly. In this scenario, there is a slight voltage drop at internal ground 38 across first transistor switch 40 in going from internal ground 38 and primary ground connection 16. This results in a current flowing from internal ground 38 to primary ground connection 16. Scenario 2 depicted in FIG. 3B represents the situation when the primary ground connection 16 has been disconnected but loss of ground detection system is working normally otherwise. In scenario 2, when ground is first lost, current from first ground terminal 36 goes through first transistor switch 40 and diodes 44 and 46 (now conducting with about a 1.2V voltage drop under forward bias). However, internal ground 38 is also increased by this same circuit and reference voltage source 22 which provides a voltage (e.g., about 5V) with reference to internal ground 38. Thus, in the end the voltage drop (from reference voltage source 22 to first ground terminal 36) does not change. Current can then flow through first transistor switch 40 to internal ground 38. More significantly, in scenario 2 current will flow through diodes 44, 46 which are associated with secondary ground 14. This will cause a voltage drop below internal ground 38 at second ground terminal 34. This voltage drop causes a drop in second output voltage 32 which can be measured and indicates that primary ground 12 has been lost. In scenario 3 depicted in FIG. 3A, primary ground 12 is lost and first transistor switch 40 is purposely open to avoid damaging the loss of ground detection system by preventing current from other external units from getting into the system. This is accomplished by setting third transistor switch 50 to "ON" which sets the input to first transistor switch 40 to about 0V thus making it to switch OFF (which is verified by line 52 input to control electronics 35). Significantly, in this scenario the time for first transistor switch 40 to open is fast on the order of about 40 ms to minimize the current flow through diode 44 and 46 from external systems. As in scenario 2, the drop in voltage at second ground terminal 34 causes a drop in second output voltage 32 which can be measured and indicates that primary ground 12 has been lost.

Figures 4A, 4B:
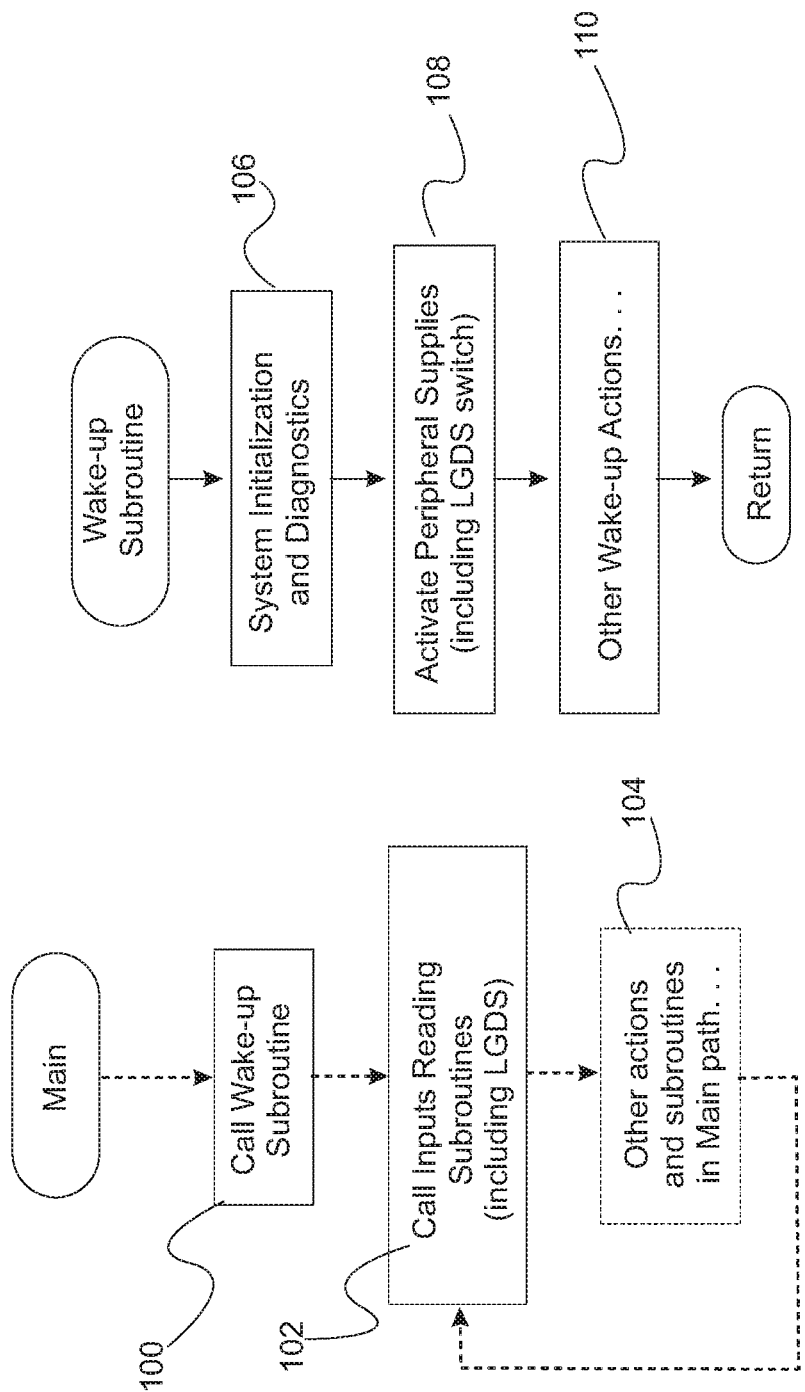
FIGS. 4A, 4B, and 4C provide flowcharts illustrating the operation of the loss of ground detection system of FIG. 2.
Figure 4C:
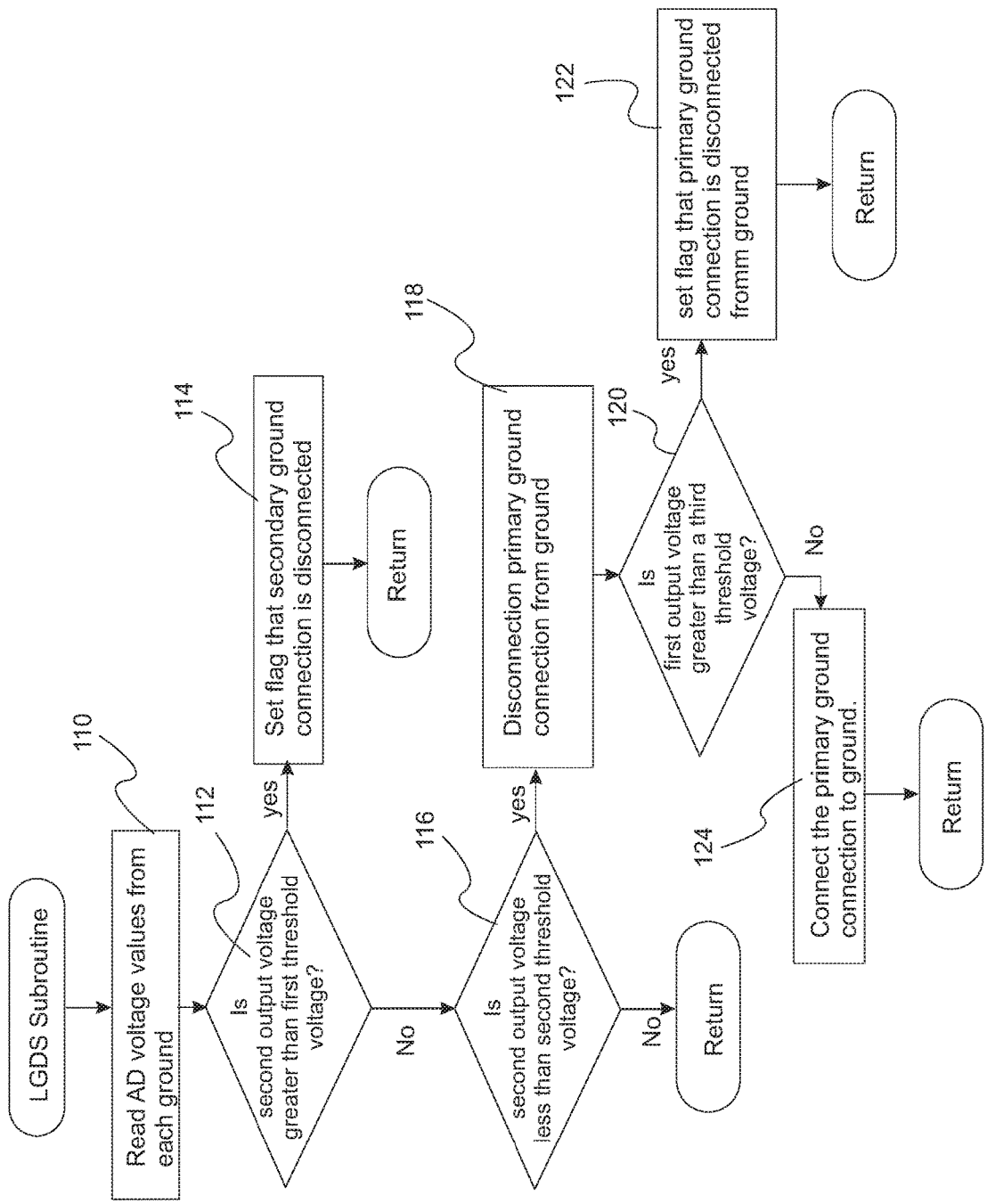

With reference to FIGS. 4A, 4B, and 4C, flow charts illustrating the operation of loss of loss of ground detection system (LGDS) 10 are provided. As depicted in FIG. 4A, the main control algorithm calls the wake-up subroutine (Box 100) and the inputs reading subroutines (Box 102) including the control routine for the loss of loss of ground detection system 10. Other actions and subroutines are also called as need in the main control algorithm (Box 104). The algorithm continued to cycle through the actions of Boxes 102 and 104. As depicted in FIG. 4B, the wakeup algorithm initializes the system and diagnostics (Box 106) and then activates peripheral power supplies including the loss of loss of ground detection system (Box 108). Other wakeup actions can also be initiated. Upon completion execution is returned to the main control subroutine. FIG. 4C provides a flow chart illustrating the implementation of the LGDS algorithm. After the loss of ground detection system is connected, the first output voltage 30 and second output voltage 32 are measured with an AD converter (Box 110). In accordance with Box 112, a determination is made as to whether or not second output voltage 32 (which is associated with secondary ground 14) is above a first predetermined threshold. If the second output voltage 32 has risen above the first predetermined threshold, then it can be concluded that secondary ground connection 18 is disconnected from ground (Box 114). If second output voltage 32 has not risen above the first predetermined threshold, a determination is made if second output voltage 32 has fallen below a second predetermined threshold (Box 116). Typically, the second threshold is less than the first threshold. Normal operation of ground loss system 10 has a range of values for first output voltage 30 and second output voltage 32. Over this normal operating range there is the first threshold of Box 112 and below this range there is the second threshold of Box 116. If second output voltage 32 has not dropped below the second threshold, the system returns to the main control algorithm. If second output voltage 32 has dropped below the second predetermined threshold, loss of ground detection system 10 is disconnected from primary ground 12 (Box 118). A determination is made if first output voltage 30 has risen over a third predetermined threshold (Box 120). If first output voltage 30 has risen over the third predetermined threshold, a determination is made that primary ground connection 16 is disconnected from ground (Box 122). The algorithm then returns to the main control algorithm. If the primary ground has not been lost, loss of ground detection system 10 is reconnected to the primary ground (Box 124). The algorithm then returns to the main control algorithm.

Figure 5:
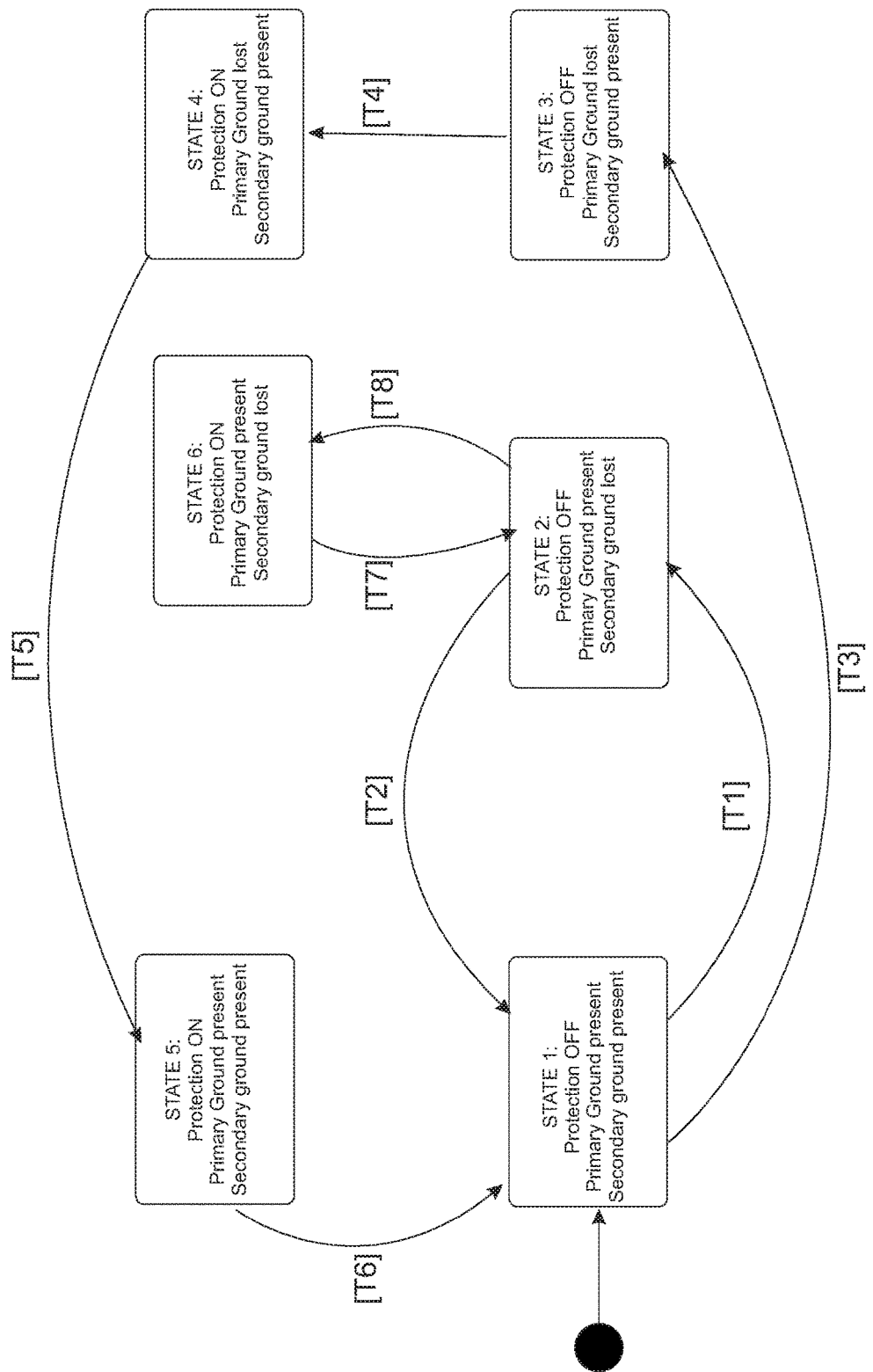
FIG. 5 is a state diagram illustrating the operation of the loss of ground detection system of FIG. 2.

FIG. 5 provides a state diagram for the operation of the loss of ground detection system 10. State 1 represents the state in which both primary ground connection 16 and a secondary ground connection 18 are connected to ground and operating properly. In this state protection is off meaning that first transistor switch 40 is ON. T1 is the transition from state 1 to state 2 in which primary ground 12 is still connected but secondary ground 14 has been lost. Protection is still off in state 2. T2 represents transition back to state 1 when second ground is reestablished. T3 is the transition to state 3 wherein primary ground 12 has been lost but secondary ground 14 is still connected. T4 is the inevitable transition to State 4 in which protection is turned on meaning the first transistor switch 40 is turned ON. T5 is the transition from state 4 to 5 wherein the ground connection is reestablished. T6 represents the investable transition to state 1 wherein the protection is turned off. T7 and T8 are the transitions to and from state 6 in which primary ground 12 is still connected but secondary ground 14 has been lost and the protection is turned on. Transition 8 is anomalous and typically avoided in the application of the present invention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A loss of ground detection system comprising:
  a reference voltage source providing a reference voltage;
  a primary ground connection connected to a primary ground;
  a secondary ground connection connected to a secondary ground;
  an internal ground;
  a combined ground integrity monitoring unit that outputs a multistage signal to control electronics, the combined ground integrity monitoring unit interposed between and in electrical communication with the reference voltage source and both of the primary ground connection and the secondary ground connection, the multistage signal including a first output voltage and a second output voltage;
  wherein the combined ground integrity monitoring unit includes: a first ground connection integrity monitoring stage and a second ground connection integrity monitoring stage;
  wherein the first ground connection integrity monitoring stage is a first voltage divider and the second ground connection integrity monitoring stage is a second voltage divider;
  wherein the control electronics comprises an A to D converter;
  a first transistor switch interposed between the primary ground connection and the internal ground such that the first transistor switch opens in response to loss of connection to the primary ground as indicated by a change of status in the multistage signal; and a diode system interposed between the secondary ground connection and the internal ground, the diode system oriented to allow flow from the internal ground to the secondary ground connection under forward bias.

2. The loss of ground detection system of claim 1, wherein the first ground connection integrity monitoring stage outputs the first output voltage, the first ground connection integrity monitoring stage being interposed between and in electrical communication with the primary ground connection and the reference voltage source; and the second ground connection integrity monitoring stage outputs the second output voltage, the second ground connection integrity monitoring stage being interposed between and in electrical communication with the secondary ground connection and reference voltage source.

3. The loss of ground detection system of claim 1, wherein the secondary ground connection provides a backup path to ground for the loss of ground detection system.

4. The loss of ground detection system of claim 3, further comprising a second transistor switch positioned between the reference voltage source and both the first voltage divider and the second voltage divider, the second transistor switch allowing the loss of ground detection system to be actuated when desired.

5. The loss of ground detection system of claim 1, wherein there is a voltage drop of less than 0.5 volts from internal ground connection to primary ground connection across the first transistor switch during normal operation in a vehicle in which there is no loss of ground, current flowing from the internal ground to the primary ground connection.

6. The loss of ground detection system of claim 1, wherein a loss of ground at the primary ground connection causes the second output voltage to drop.

7. The loss of ground detection system of claim 6, wherein a first current flows through the first transistor switch to internal ground.

8. The loss of ground detection system of claim 7, wherein the diode system includes a first diode a second diode in series.

9. The loss of ground detection system of claim 1, wherein a loss of ground at the secondary ground connection causes the second output voltage to rise to a value of the reference voltage plus or minus 10%.

10. The loss of ground detection system of claim 4, further comprising a third transistor switch that controls the first transistor switch.

11. The loss of ground detection system of claim 1, wherein the primary ground connection is attached to a primary vehicle chassis ground.

12. A method for determining ground loss by a loss of ground detection system that includes:

a reference voltage source providing a reference voltage;

a primary ground connection connected to a primary ground;

a secondary ground connection connected to a secondary ground;

an internal ground; and a combined ground integrity monitoring unit that outputs a multistage signal to control electronics, the combined ground integrity monitoring unit interposed between and in electrical communication with the reference voltage source and both of the primary ground connection and the secondary ground connection, the multistage signal including a first output voltage and a second output voltage, the method comprising:

a) measuring the first output voltage and the second output voltage after the loss of ground detection system is installed in a target system;

b) determining that the primary ground connection is disconnected from the primary ground if the second output voltage is lower than a second predetermined threshold voltage c) disconnecting the internal ground from primary ground connection if the second output voltage has fallen below the second predetermined threshold voltage;

d) determining that the primary ground connection is disconnected from ground if the first output voltage is higher than a third predetermined threshold voltage; and e) reconnecting the primary ground connection to primary ground if the first output voltage is not above the third predetermined threshold voltage;

wherein the combined ground integrity monitoring unit includes: a first ground connection integrity monitoring stage and a second ground connection integrity monitoring stage;

wherein the first ground connection integrity monitoring stage is a first voltage divider and the second ground connection integrity monitoring stage is a second voltage divider; and wherein the control electronics comprises an A to D converter.

13. The method of claim 12, the first ground connection integrity monitoring stage outputs the first output voltage, the first ground connection integrity monitoring stage being interposed between and in electrical communication with the primary ground connection and the reference voltage source; and the second ground connection integrity monitoring stage outputs the second output voltage, the second ground connection integrity monitoring stage being interposed between and in electrical communication with the secondary ground connection and reference voltage source.

14. The method of claim 13, wherein the secondary ground connection provides a backup path to ground for the loss of ground detection system.

15. The method of claim 13, wherein the loss of ground detection system further comprises a first transistor switch interposed between the primary ground connection and the internal ground such that the first transistor switch opens in response to loss of connection to the primary ground as indicated by a change of status in multistage signal.

16. The method of claim 15, wherein the loss of ground detection system further comprises a second transistor switch positioned between the reference voltage source and both the first voltage divider and the second voltage divider, the second transistor switch allowing the loss of ground detection system to be actuated when desired.

17. The method of claim 15, wherein a loss of ground at the primary ground connection causes the second output voltage to drop, wherein a first current flows through the first transistor switch to internal ground.

18. The method of claim 17, wherein the loss of ground detection system further comprises a diode system interposed between the secondary ground connection and the internal ground, the diode system oriented to allow flow from the internal ground to secondary ground connection under forward bias.

19. The method of claim 12, further comprising determining that the secondary ground connection is disconnected from ground if the second output voltage is higher than a first predetermined threshold voltage prior to step b).

* * * * *

UNITED STATES PATENT AND TRADEMARK OFFICE
CERTIFICATE OF CORRECTION

PATENT NO. : 11,067,640 B2
APPLICATION NO. : 16/021638
DATED : July 20, 2021
INVENTOR(S) : Daniel Ruiz-Garcia et al.

Page 1 of 1

It is certified that error appears in the above-identified patent and that said Letters Patent is hereby corrected as shown below:

In the Claims

Column 7, Line 43, Claim 8:
After "diode system includes a first diode"
Insert -- and --.

Column 8, Line 32, Claim 13:
After "The method of claim 12,"
Insert -- wherein --.

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*